United States Patent
Cheng

(10) Patent No.: US 7,614,912 B2
(45) Date of Patent: Nov. 10, 2009

(54) CARD CONNECTOR WITH DUMMY CARD

(75) Inventor: Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 6 days.

(21) Appl. No.: 11/980,059

(22) Filed: Oct. 30, 2007

(65) Prior Publication Data

US 2008/0102664 A1 May 1, 2008

(30) Foreign Application Priority Data

Oct. 30, 2006 (TW) ............................... 95219117 U

(51) Int. Cl.
*H01R 13/648* (2006.01)
(52) U.S. Cl. .................. 439/607; 439/946; 439/159
(58) Field of Classification Search ................. 439/607, 439/159, 160, 630, 946
See application file for complete search history.

(56) References Cited

U.S. PATENT DOCUMENTS

| | | | | |
|---|---|---|---|---|
| 5,588,850 A | * | 12/1996 | Pan et al. | 439/92 |
| 6,144,563 A | | 11/2000 | Feldman | |
| 6,269,005 B1 | * | 7/2001 | Tung et al. | 361/737 |
| 2007/0243736 A1 | * | 10/2007 | Maruyama | 439/159 |

* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

A card connector (100) for receiving a card, includes an insulative housing (10) receiving a number of terminals (20), a shield plate (40) assembled on the insulative housing, and a pair of supporting plates (70). The shield plate includes a pair of lateral walls (42, 43). The lateral walls define an inserting cutout opposite to the insulative housing along a card inserting direction. The supporting plates coupled with corresponding lateral walls of the shield plate, extends beyond the inserting cutout along a direction opposite to the card inserting direction, and each supporting plate forms an engaging portion (77) at the portion beyond the inserting cutout.

16 Claims, 5 Drawing Sheets

CARD CONNECTOR WITH DUMMY CARD

BACKGROUND OF THE INVENTION

1. Field of the Invention

The present invention relates to a card connector, and particularly to a card connector which is capable of receiving a dummy card.

2. Description of Prior Arts

Nowadays, the PC card is used as an external equipment for increasing the storage capability of the electrical consumer products, like Mobile phone, Digital camera, etc. The electrical card connector is used for electrically connecting the PC card and the electrical consumer products. PCMCIA (Personal Computer Memory Card International Association) discloses a new standard PC card in 2003, and name it Express card. There are two types of Express card. The one is L-shaped, and the other one is I-shaped. When the card is not inserted into the card connector, a dummy card is inserted into the card connector for avoiding the dust into the card connector. Accordingly, how to fix the dummy card in the card connector is a new problem. This problem is especially important to the card connector used on the Note-book computer because the Note-book computer is frequently carried around.

Obviously, it is desirable to have an improved structure to retain the dummy card in the card connector.

SUMMARY OF THE INVENTION

An object of the present invention is to provide a card connector capable of retaining a dummy card firmly.

To achieve the above object, a card connector for receiving a card includes an insulative housing receiving a number of terminals, a shield plate assembled on the insulative housing, and a pair of supporting plates. The shield plate includes a pair of lateral walls. The lateral walls define an inserting cutout opposite to the insulative housing along a card inserting direction. The supporting plates coupled with corresponding lateral walls of the shield plate, extends beyond the inserting cutout along a direction opposite to the card inserting direction, and each supporting plate forms an engaging portion at the portion beyond the inserting cutout.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Description of the preferred embodiment of this invention, a card connector will be described with reference to FIG. 1-FIG. 5 so as to facilitate better understanding of this invention.

Figure 1:
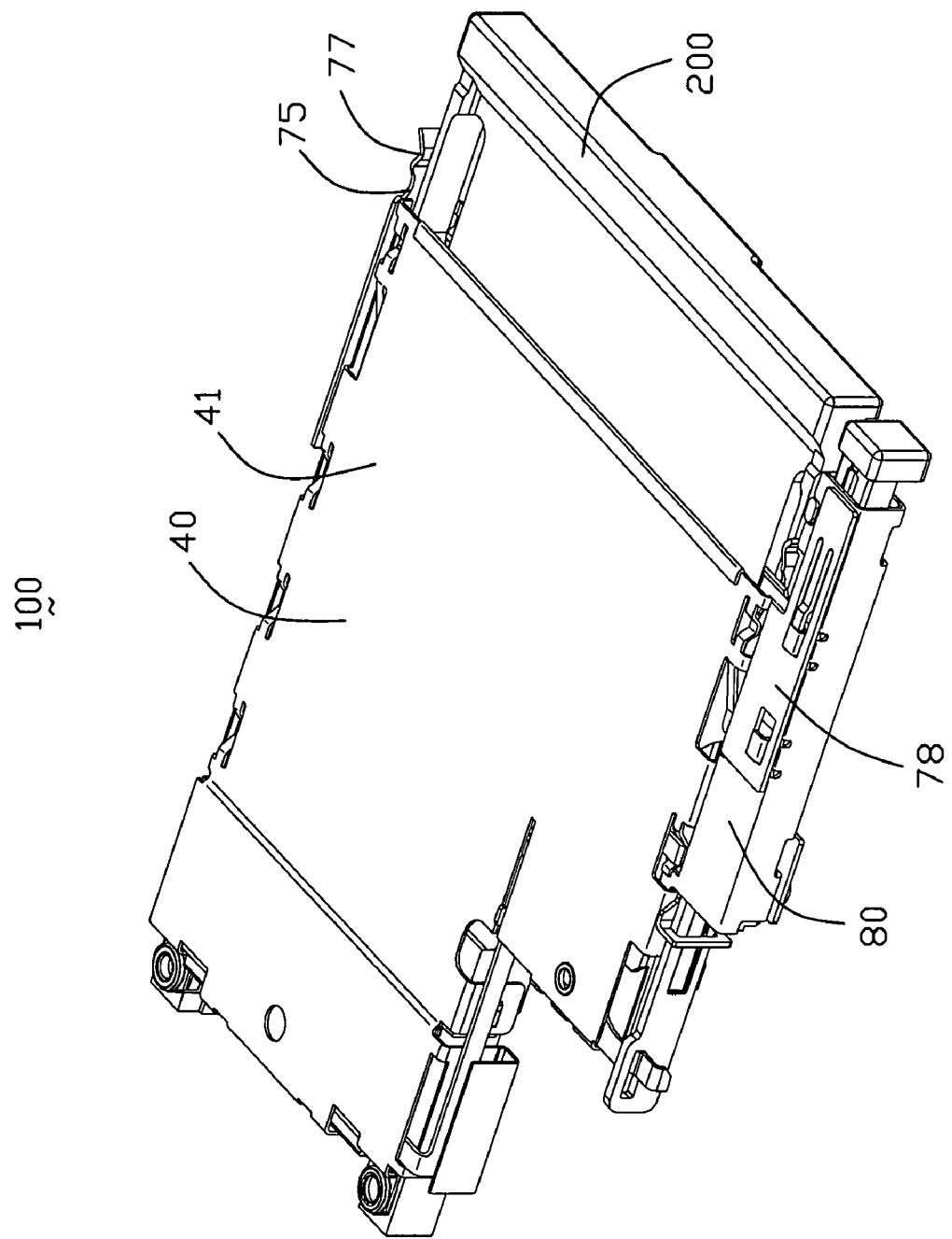
FIG. 1 is an assembled, perspective view of a card connector in accordance with the present invention.

Referring to FIG. 1, a card connector 100 comprises an insulative housing 10, a plurality of terminals 20, a shield plate 40 assembled on the insulative housing 10, a bottom plate 50 assembled under the shield plate 40, a pair of supporting plates assembled on the opposite sides of the shield plate 40 and an ejector 80.

The longitudinal insulative housing 10 comprises a longitudinal base portion 11, a pair of arms 12 forwardly extending from the opposite ends of the base portion 11, and a mating portion 14 extending forwardly from the base portion 11 and sandwiched by the arms 12. The mating portion 14 defines a plurality of receiving passageways for receiving corresponding terminals 20.

Figure 2:
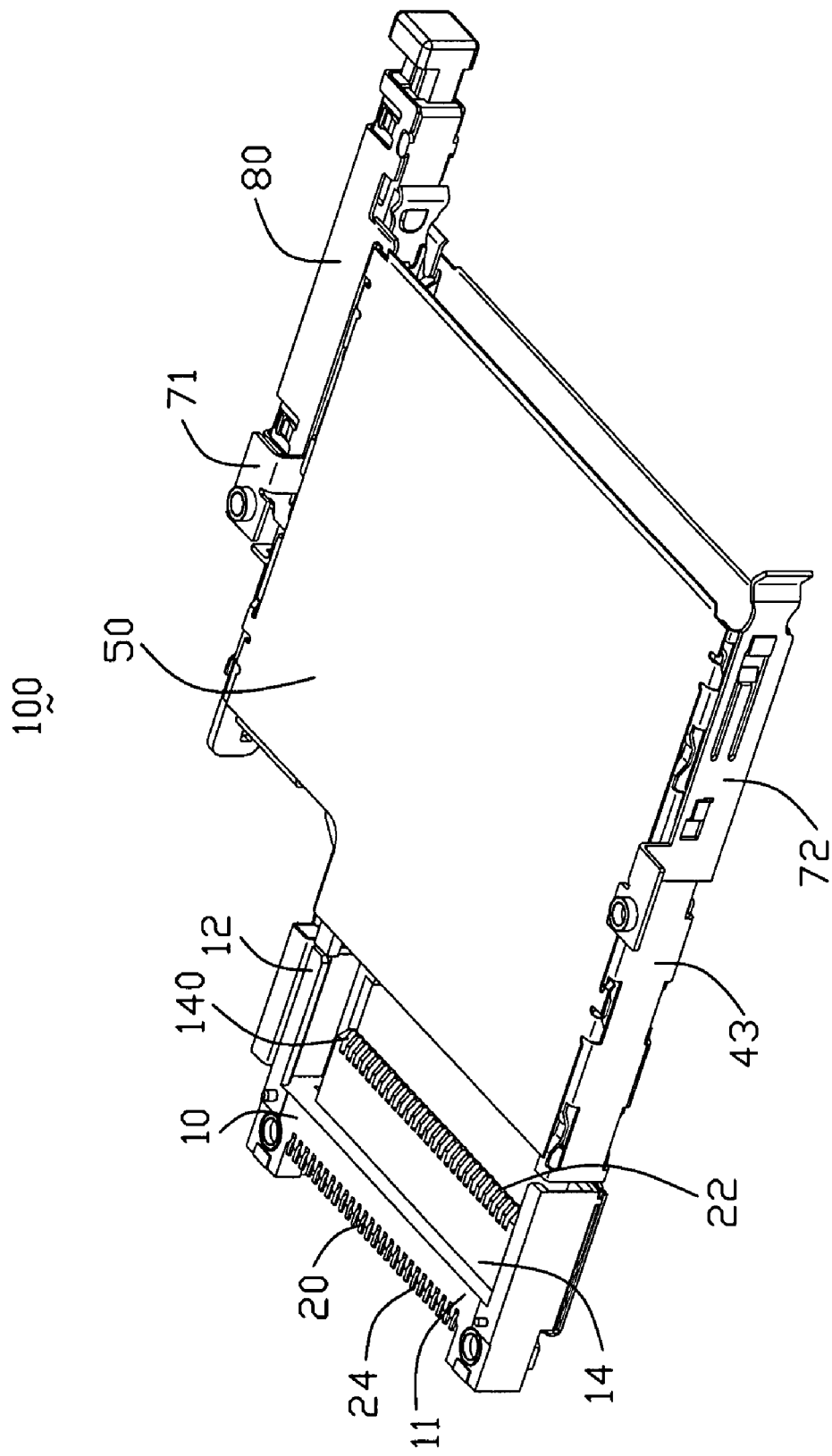
FIG. 2 is a view similar to FIG. 1, but taken from a different aspect.

Referring to FIG. 2, the shield plate 40 comprises a main body 41 and a first lateral wall 42 and a second lateral wall 43, respectively, extending downwardly from opposite sides of the main body 41. The lateral walls 42, 43 define an inserting cutout (not labeled) opposite to the insulative housing 10 along a card inserting direction. A plurality of blocks 44 are formed on the first and second lateral walls 42, 43. The ejector is assembled on the first lateral wall 42. The bottom plate 50 has an approximate sharp with the shield plate 40, and assembled on the bottom of the shield plate 40.

Figure 3:
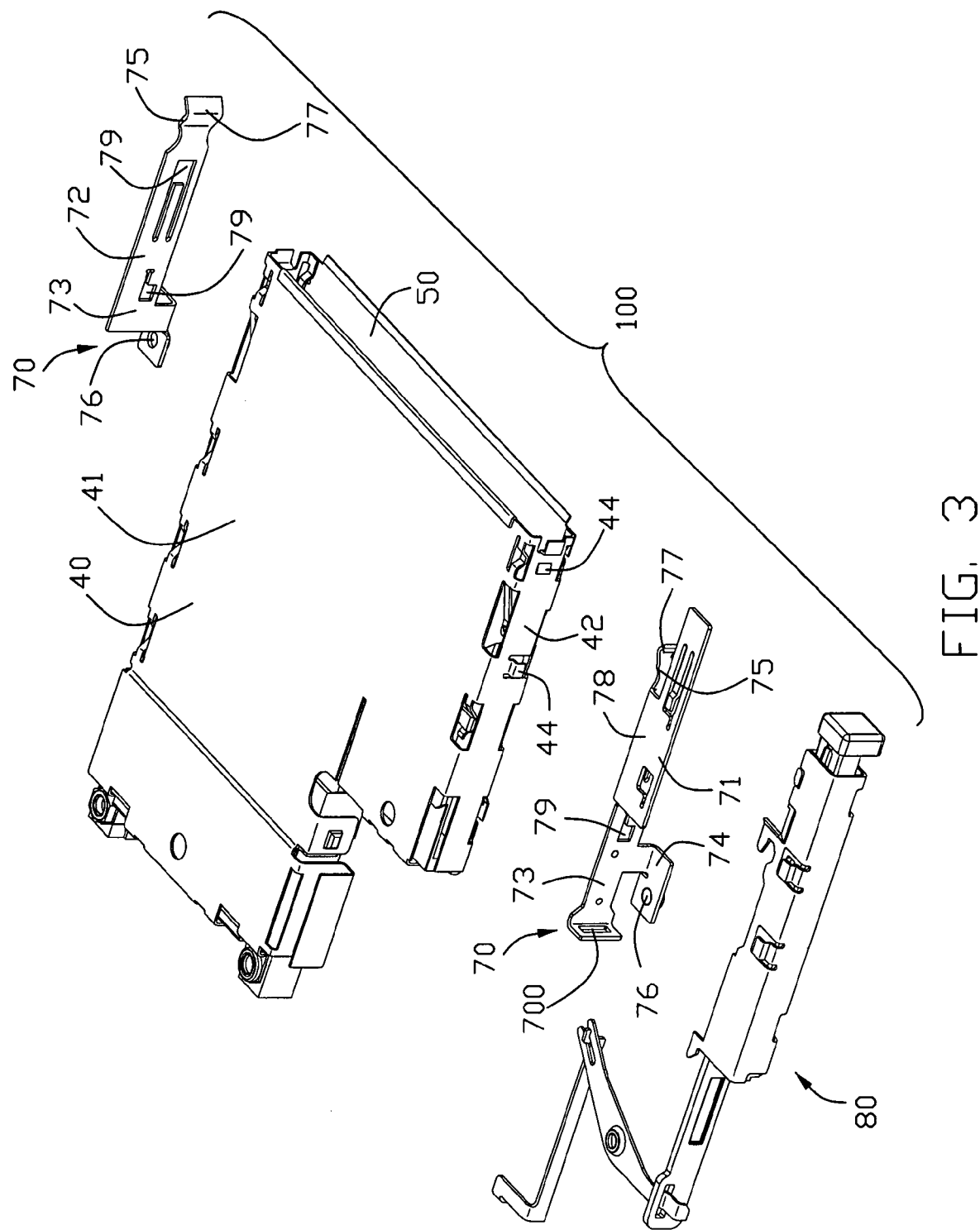
FIG. 3 is an exploded, perspective view of the card connector shown in FIG. 1.
Figure 4:
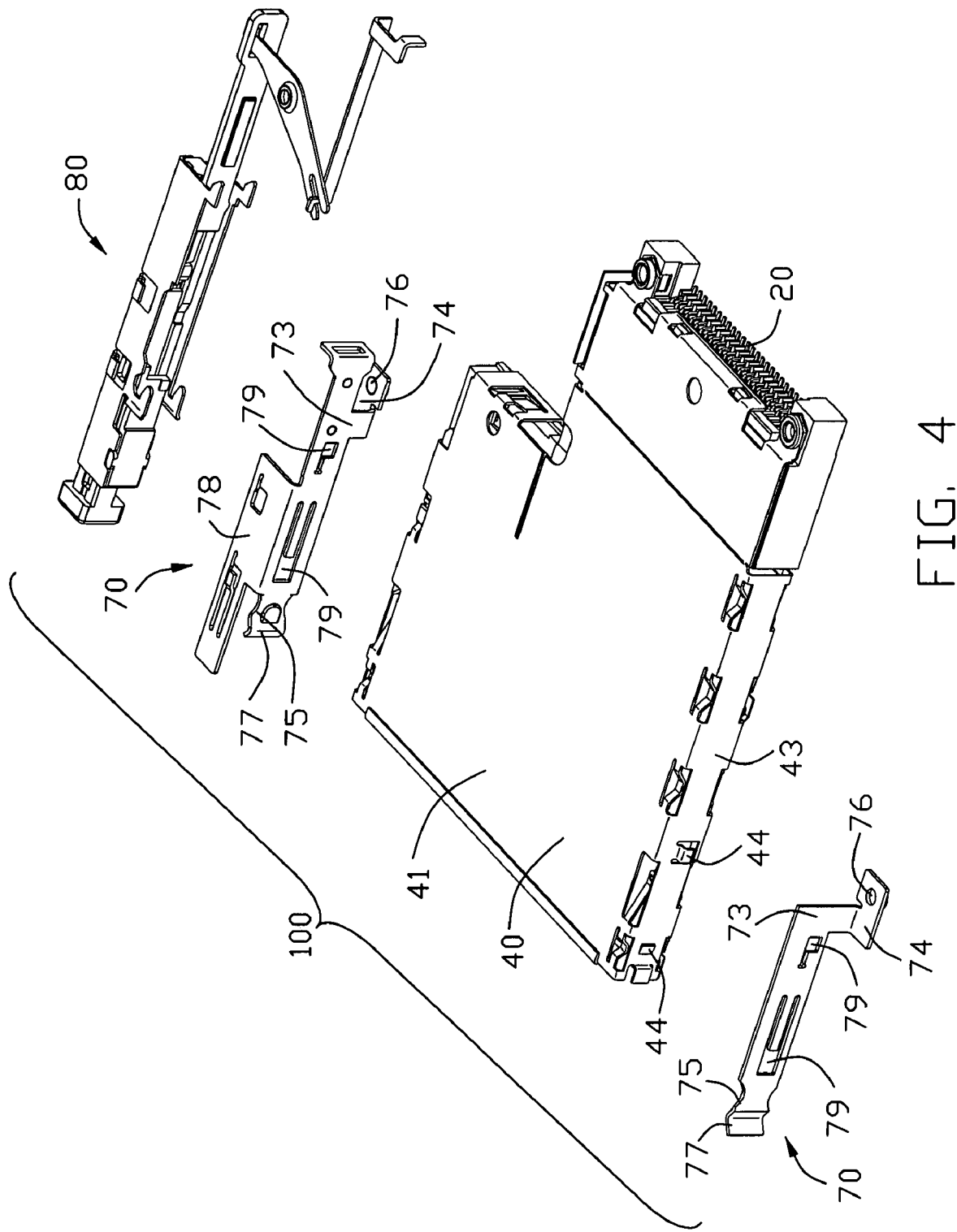
FIG. 4 is a view similar to FIG. 3, but taken from a different aspect.

Referring to FIG. 3 and FIG. 4, the supporting plates 70 comprises a first plate 71 assembled between the first lateral wall 42 of the shield plate 40 and the ejector 80, and the second plate 72 assembled on the second wall 43. Each supporting plate 70 comprises a base plate 73 retained on the lateral wall of the shield plate 40, a horizontal mounting plate 74 extending from the base plate 73, and a retaining plate 75 horizontally extending from the base plate 73. The mounting plate 73 defines a hole 76 for mounting the card connector 100 onto a printed circuit board. The retaining plate 75 is resilient, and forms an engaging portion 77 at the distal end thereof. The first plate 71 forms a locking plate 78 horizontally extending from the base plate 73 locking with the top surface of the ejector 80. In present embodiment, the engaging portion 77 is a protuberance. The base plate 73 defines a plurality of cutouts 79 for mating with the blocks 44 of the shield plate 40 for retaining the supporting plates 70 to the shield plate 40. The supporting plate further defines a slit 700 at a distal end thereof, the ejector 80 partially passes through the slit 700 (shown in FIG. 1).

Figure 5:
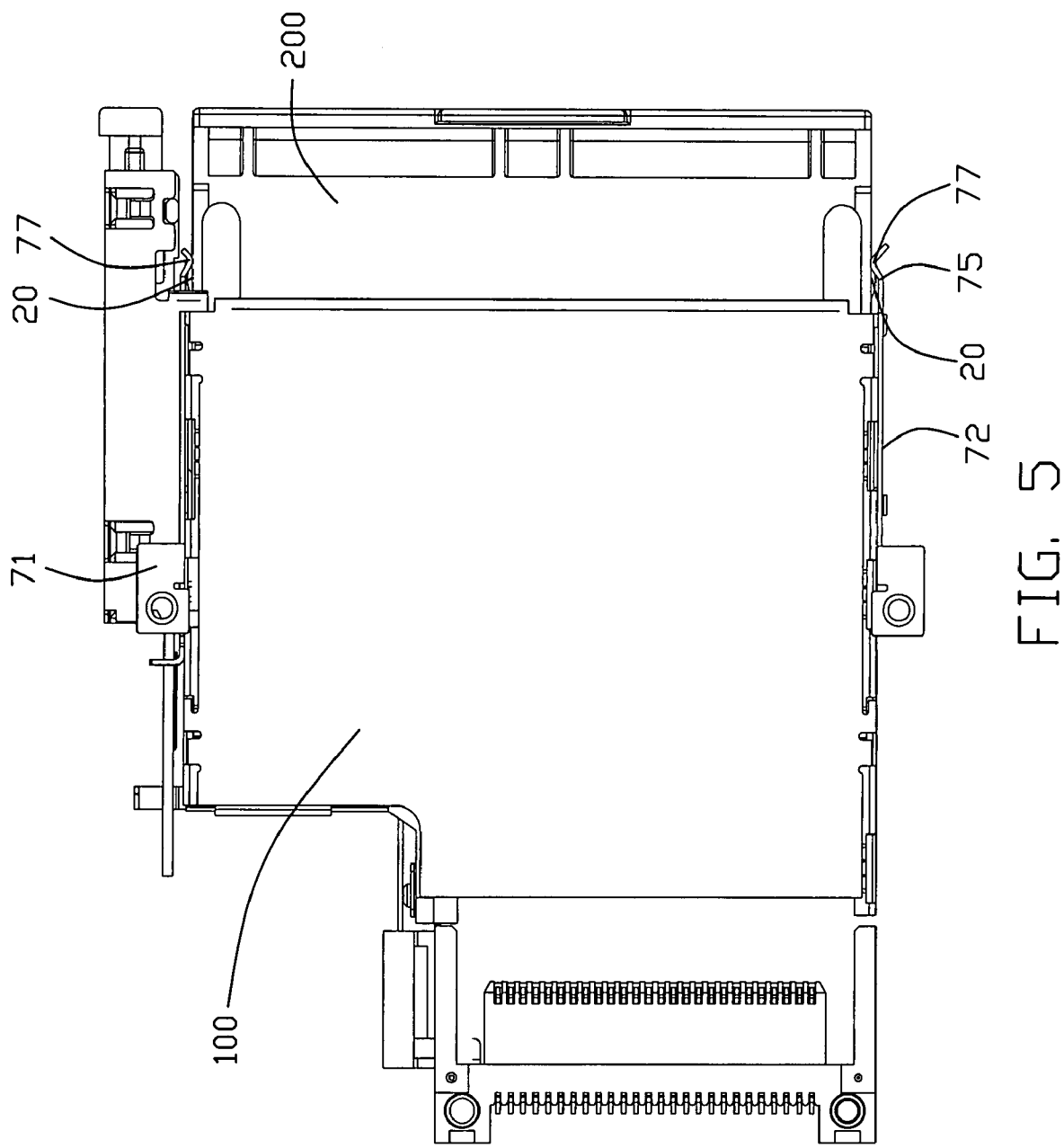
FIG. 5 is a top view of the card connector shown in FIG. 1.

Referring to FIG. 5, the card connector assembly further comprises a dummy card 200, the dummy card forms a pair of resisting portions 20 at the opposite ends thereof. In present embodiment, the resisting portion 20 is a projecting block. After the dummy card 200 is inserted into the card connector 100, the engaging portion 77 of the supporting plates 70 locking with the resisting portion 20 of the dummy card 200. Accordingly, the dummy card 200 is retained in the card connector 100 more firmly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A card connector for receiving a card, comprising:
an insulative housing receiving a plurality of terminals;
a shield plate assembled on the insulative housing, and comprising a pair of lateral walls, the lateral walls defining an inserting cutout opposite to the insulative housing along a card inserting direction; and a pair of supporting plates coupled with corresponding lateral walls of the shield plate, each supporting plate extending beyond the inserting cutout along a direction opposite to the card inserting direction to form an engaging portion; and wherein an elector is assembled on one of the lateral walls, and wherein one of the supporting plates has a locking plate retained on the top surface of the ejector.

2. The card connector as described in claim 1, wherein the supporting plate has a mounting plate capable of mounting on a printed circuit board.

3. The card connector as described in claim 1, wherein the supporting plate defines a slit at a distal end thereof opposite to the engaging portion, and the ejector partially passes through the slit.

4. The card connector as described in claim 1, further comprising a dummy card, the dummy card defining a pair of resisting portions locking with the engaging portions of the supporting plates.

5. The card connector as described in claim 4, wherein the engaging portion of the supporting plates comprises a protuberance.

6. The card connector as described in claim 5, wherein the resisting portion of the dummy card comprises a projecting block.

7. The card connector as described in claim 6, wherein a portion of the supporting plate beyond the inserting cutout is resilient.

8. An electrical card connector assembly comprising an insulative housing receiving a plurality of terminals;

a shield plate assembled on the insulative housing and cooperating with the housing to define a card receiving cavity, and two lateral walls extending from two sides of the shield plate;

an ejector assembled on one of the lateral walls:

a pair of supporting plates coupled with corresponding lateral wall of the shield plate, and one of the supporting plates having a locking plate retained on the top surface of the ejector; and an engagement portion extending toward the card receiving cavity;

wherein said engagement portion is dimensioned and positioned not to engage a real card which couples to the terminal with retention forces therebetween, but to engage a resisting portion of a dummy card which couples no terminals without any retention forces therebetween.

9. The connector assembly as claimed in claim 8, wherein said engagement portion extends inwardly toward the card receiving cavity in a lateral direction for engagement with the resisting portion, which is funned on a lateral edge of the dummy card.

10. The connector assembly as claimed in claim 9, wherein said engagement portion includes two pieces respectively located by two sides of the shell.

11. The connector assembly as claimed in claim 8, wherein said engagement portion is located proximate an entrance of the card receiving cavity.

12. The connector assembly as claimed in claim 11, wherein said engagement portion is located outside of the entrance of the card receiving cavity.

13. An electrical card connector assembly comprising:

an insulative housing receiving a plurality of terminals;

a shield plate assembled on the insulative housing and cooperating with the housing to define a card receiving cavity for receiving an electronic card therein, and an engagement portion located laterally beside a moving path of an electronic card and extending inwardly in a lateral direction; wherein said engagement portion is dimensioned and positioned not to engage a real card in a front-to-back direction, which couples to the terminal with retention forces therebetween, but to engage an resisting portion of a dummy card which essentially fully occupies the card receiving cavity in a vertical direction while coupling no terminals without any retention forces therebetween; wherein said engagement portion engages the resisting portion, in a front-to-back direction, which is formed on a lateral edge of the dummy card; wherein said lateral direction, said vertical direction and said front-to-back direction are perpendicular to one another.

14. The connector assembly as claimed in claim 13, wherein said engagement portion includes two pieces respectively located by two sides of the shell.

15. The connector assembly as claimed in claim 13, wherein said engagement portion is located proximate an entrance of the card receiving cavity.

16. The connector assembly as claimed in claim 15, wherein the engagement portion is located outside of the entrance.

* * * * *